(12) United States Patent
Kim et al.

(10) Patent No.: US 10,269,873 B2
(45) Date of Patent: Apr. 23, 2019

(54) ELECTROLUMINESCENT DISPLAY DEVICE

(71) Applicant: LG Display Co., Ltd., Seoul (KR)

(72) Inventors: Byungsoo Kim, Goyang-si (KR);
YongMin Ha, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/892,177

(22) Filed: Feb. 8, 2018

(65) Prior Publication Data

US 2018/0247982 A1 Aug. 30, 2018

(30) Foreign Application Priority Data

Feb. 28, 2017 (KR) .................. 10-2017-0026248

(51) Int. Cl.
*H01L 27/32* (2006.01)
*H01L 51/52* (2006.01)

(52) U.S. Cl.
CPC ...... *H01L 27/3213* (2013.01); *H01L 51/5218* (2013.01); *H01L 51/5234* (2013.01); *H01L 51/5278* (2013.01); *H01L 27/3244* (2013.01); *H01L 51/5265* (2013.01); *H01L 2251/5315* (2013.01)

(58) Field of Classification Search
None
See application file for complete search history.

(56) References Cited

U.S. PATENT DOCUMENTS

| | | | |
|---|---|---|---|
| 9,111,882 B1* | 8/2015 | Chen | H01L 27/322 |
| 2010/0109518 A1* | 5/2010 | Suzuki | H01L 51/5096 |
| | | | 313/504 |
| 2012/0249602 A1* | 10/2012 | Liu | G09G 3/2003 |
| | | | 345/690 |
| 2014/0084256 A1* | 3/2014 | Kim | H01L 51/504 |
| | | | 257/40 |
| 2015/0280159 A1* | 10/2015 | Kim | H01L 27/32 |
| | | | 257/40 |
| 2017/0287993 A1* | 10/2017 | Takata | H01L 27/3211 |

FOREIGN PATENT DOCUMENTS

KR 20080105640 12/2008

\* cited by examiner

*Primary Examiner* — J. E. Schoenholtz
(74) *Attorney, Agent, or Firm* — Fenwick & West LLP (57) ABSTRACT

An electroluminescent display device according to an exemplary embodiment of the present disclosure includes a first light emitting unit which is disposed on the anode and includes an emissive layer, a charge generation layer disposed on the first light emitting unit, a second light emitting unit which is disposed on the charge generation layer and includes a second emissive layer, and a cathode disposed on the second light emitting unit in which each of the first light emitting unit and the second light emitting unit includes a plurality of pixel emissive layers corresponding to a first pixel, a second pixel, a third pixel, and a fourth pixel, and the first pixel emits red light, the second pixel emits green light, the third pixel emits blue light, and the fourth pixel emits yellow-green light to lower the power consumption of the organic light emitting display device.

18 Claims, 4 Drawing Sheets

ELECTROLUMINESCENT DISPLAY DEVICE

CROSS-REFERENCE TO RELATED APPLICATION

This application claims the priority of Republic of Korea Patent Application No. 10-2017-0026248 filed on Feb. 28, 2017, in the Korean Intellectual Property Office, the disclosure of which is incorporated herein by reference in its entirety.

BACKGROUND

Field of Technology

The present disclosure relates to an electroluminescent display device, and more particularly to an electroluminescent display device with reduced power consumption.

Description of the Related Art

As a full-fledged information-oriented age has come, a display device field which visually displays an electrical information signal is rapidly developing. Further, studies for improving performances of various display devices, such as a thin thickness, a light weight, and a low power consumption are being continued.

As representative display devices, there are a liquid crystal display device (LCD), a plasma display panel device (PDP), a field emission display device (FED), an electro-wetting display device (EWD), and an organic light emitting display device (OLED).

Among the above display devices, the organic light emitting display device is a self-emitting display device. Differently from the liquid crystal display device which is most widely being used, the organic light emitting display device does not need a separate light source, so that it is advantageous to achieve light weight and thin thickness. Further, the organic light emitting display device is advantageous in power consumption due to a low voltage driving characteristic and has excellent color embodiment, a high response speed, a wide viewing angle, and a high contrast ratio (CR) so that it is utilized in various fields.

The organic light emitting display device is formed by disposing an emissive layer (EML) which uses an organic material between an anode and a cathode. When the anode injects holes into the emissive layer and the cathode injects electrons into the emissive layer, the holes and the electrons are re-coupled in the emissive layer to form exciton and emit light.

The emissive layer of the organic light emitting display device contains a host material and a dopant material and both materials interact with each other. In this case, the host serves to generate exciton from the electrons and the holes and transmit energy to the dopant. The dopant is a dyeable organic material which is added in a small amount and serves to receive energy from the host to convert the energy into light.

An area of the organic light emitting display device where light is emitted is referred to as a pixel. The pixel is formed by combining a plurality of sub pixels which emits one color light and the individual sub pixels emit different color light to create one color. For example, sub pixels which emit red light, green light, and blue light form one pixel.

The organic light emitting display device which includes an emissive layer using an organic material is encapsulated using glass, metal or a film to block moisture or oxygen from the outside to suppress oxidation of the emissive layer and the electrode and protect the organic light emitting display device from a physical impact applied from the outside.

SUMMARY

Sub pixels which are included in the pixel of the organic light emitting display device to emit different color light are configured by different emissive layer materials and have different power consumption according to the emissive layer materials. In this case, an emissive layer of a sub pixel which requires a high power consumption may cause the entire power consumption of the organic light emitting display device to be increased.

The inventors recognized the above-mentioned problems and invented an organic light emitting display device having a new pixel structure which may lower power consumption of the organic light emitting display device.

Objects of the exemplary embodiment of the present disclosure are not limited to the above-mentioned objects, and other objects, which are not mentioned above, can be clearly understood by those skilled in the art from the following descriptions.

According to an aspect of the present disclosure, there is provided an electroluminescent display device including an anode, a first light emitting unit which is disposed on the anode and includes a first emissive layer, a charge generation layer disposed on the first light emitting unit, a second light emitting unit which is disposed on the charge generation layer and includes a second emissive layer, and a cathode disposed on the second light emitting unit, in which each of the first light emitting unit and the second light emitting unit includes a first pixel, a second pixel, a third pixel, and a fourth pixel, and the first pixel includes an emissive layer which emits red light, the second pixel includes an emissive layer which emits green light, the third pixel includes an emissive layer which emits blue light, and the fourth pixel includes an emissive layer which emits different color light from the first pixel, the second pixel, and the third pixel.

According to another aspect of the present disclosure, there is provided an electroluminescent display device including an anode, a light emitting unit which is disposed on the anode and includes an emissive layer; and a cathode disposed on the light emitting unit, in which at least one light emitting unit is provided, and the light emitting unit includes a plurality of pixel emissive layers corresponding to a first pixel, a second pixel, a third pixel, and a fourth pixel which emit different color light.

According to another aspect of the present disclosure, there is provided an electroluminescent display device including an anode, a first light emitting unit which is disposed on the anode and includes a first emissive layer, a charge generation layer on the first emissive layer, a second light emitting unit which is disposed on the charge generation layer and includes a second emissive layer; and a cathode disposed on the second light emitting unit, in which each of the first light emitting unit and the second light emitting unit includes a plurality of pixel emissive layers corresponding to a first pixel, a second pixel, a third pixel, and a fourth pixel, and the first pixel emits red light, the second pixel emits green light, the third pixel emits blue light, and the fourth pixel emits yellow-green light so that when the first pixel, the second pixel, the third pixel, and the fourth pixel emit light to represent white light, a luminous efficiency for a pixel including an emissive layer having a low luminous efficiency among the pixels is lowered.

The organic light emitting display device according to an exemplary embodiment of the present disclosure includes a sub pixel which emits yellow-green light having low power consumption in addition to sub pixels which emit red, green, and blue light to lower the power consumption of the organic light emitting display device.

The organic light emitting display device according to an exemplary embodiment of the present disclosure further includes a sub pixel including a yellow-green emissive layer to lower a luminance efficiency for a sub pixel including a red emissive layer which has a lower luminous efficiency than other emissive layers. Therefore, the power consumption of the organic light emitting display device may be lowered.

Further, in the organic light emitting display device according to the exemplary embodiment of the present disclosure, at least two light emitting units which include sub pixels including red, green, blue, and yellow-green emissive layers are configured. Therefore, a life span and efficiency of the organic light emitting display device may be improved and the power consumption of the organic light emitting display device may be lowered.

Objects of the present disclosure are not limited to the above-mentioned objects, and other objects, which are not mentioned above, can be clearly understood by those skilled in the art from the following descriptions.

The objects to be achieved by the present disclosure, the means for achieving the objects, and effects of the present disclosure described above do not specify essential features of the claims, and, thus, the scope of the claims is not limited to the disclosure of the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Advantages and characteristics of the present disclosure and a method of achieving the advantages and characteristics will be clear by referring to exemplary embodiments described below in detail together with the accompanying drawings. However, the present disclosure is not limited to exemplary embodiment disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprise of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely bonded to or combined with each other and can be interlocked and operated in technically various ways, and the embodiments can be carried out independently of or in association with each other.

In the following exemplary embodiments, an organic light emitting display device will be mainly described. However, the exemplary embodiments of the present disclosure are not limited to an organic light emitting display device but may be applied to an inorganic light emitting display device including an inorganic light emitting material. For example, the exemplary embodiments may also be applied to a quantum dot display device.

Figure 1:
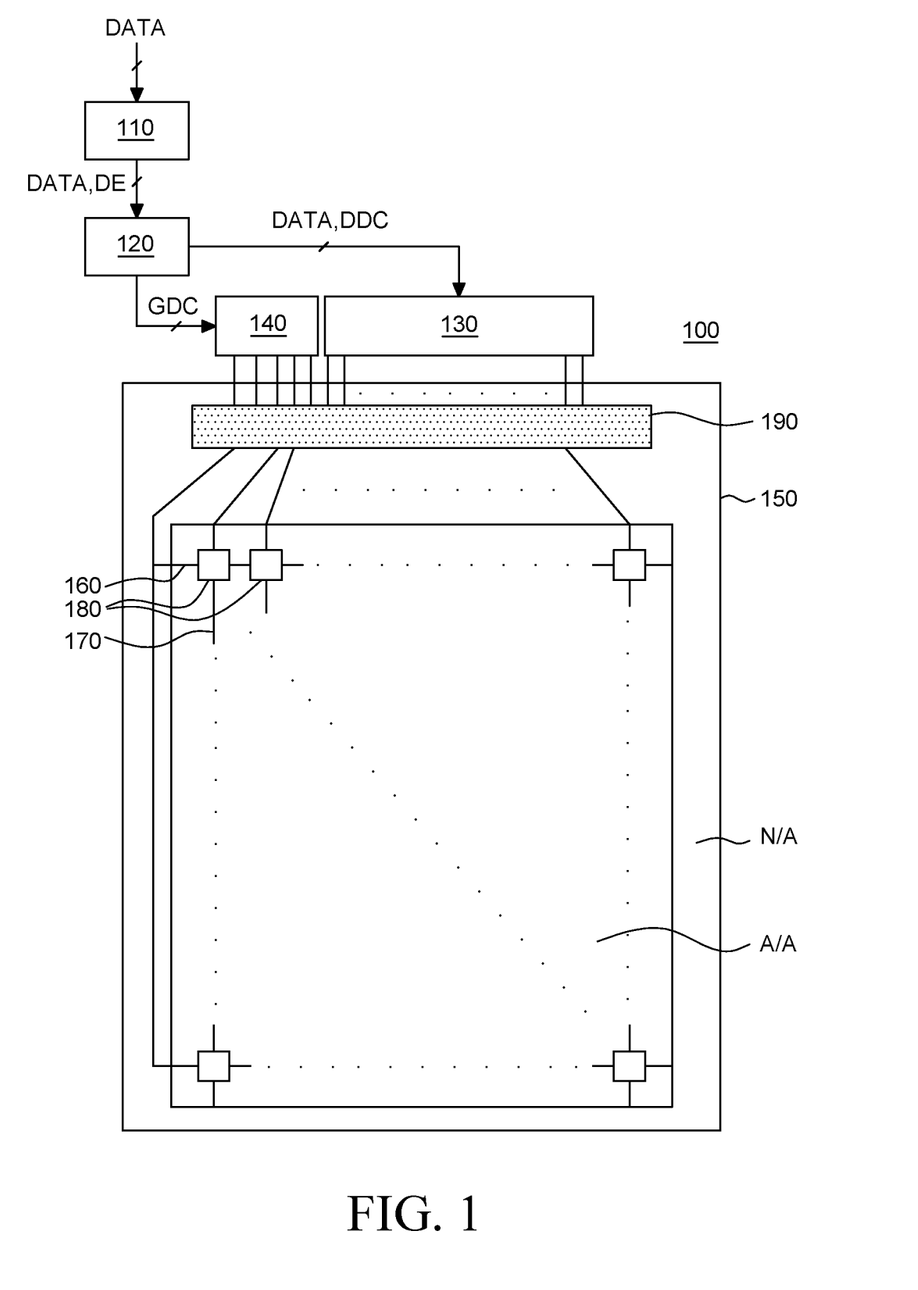
FIG. 1 is a plan view of an organic light emitting display device according to an exemplary embodiment of the present disclosure.

FIG. 1 is a plan view illustrating an organic light emitting display device 100 according to an exemplary embodiment of the present disclosure.

Referring to FIG. 1, the organic light emitting display device 100 includes an image processing unit 110, a timing controller 120, a data driver 130, a gate driver 140, and a substrate 150.

The image processing unit 110 outputs a data signal DATA and a data enable signal DE supplied from the outside. The image processing unit 110 may further output one or more of a vertical synchronization signal, a horizontal synchronization signal, and a clock signal.

The timing controller 120 receives the data signal DATA together with the data enable signal DE and a driving signal including the vertical synchronization signal, the horizontal synchronization signal, and the clock signal from the image processing unit 110. The timing controller 120 outputs a gate timing control signal GDC for controlling an operating timing of the gate driver 140 and a data timing control signal DDC for controlling an operating timing of the data driver 130, based on the driving signal.

The data driver 130 samples and latches the data signal DATA supplied from the timing controller 120 in response to the data timing control signal DDC supplied from the timing controller 120 to convert the data signal into a gamma reference voltage and output the gamma reference voltage.

The gate driver 140 outputs a gate signal while shifting a level of the gate voltage in response to the gate timing control signal GDC supplied from the timing controller 120.

The substrate 150 includes an active area A/A in which a pixel 180 which actually emits light through a thin film transistor and an organic light emitting element is disposed and a non-active area N/A which encloses an outer circumference of the active area A/A.

The active area A/A includes the pixel 180 and a data line 170 which transmits a data signal generated in the outside to the pixel 180 and a gate line 160 which transmits a gate signal to the pixel 180.

The gate signal and the data signal input from the outside of the substrate 150 are transmitted to the pixel 180 through the gate line 160 and the data line 170 via a circuit unit 190 in which various circuits are disposed to drive the pixel 180.

In this case, the data driver 130 or the gate driver 140 may be bonded to the substrate 150 by an anisotropic conductive film (ACF) at one side of the circuit unit 190 or bonded through a flexible printed circuit (FPC).

Figure 2:
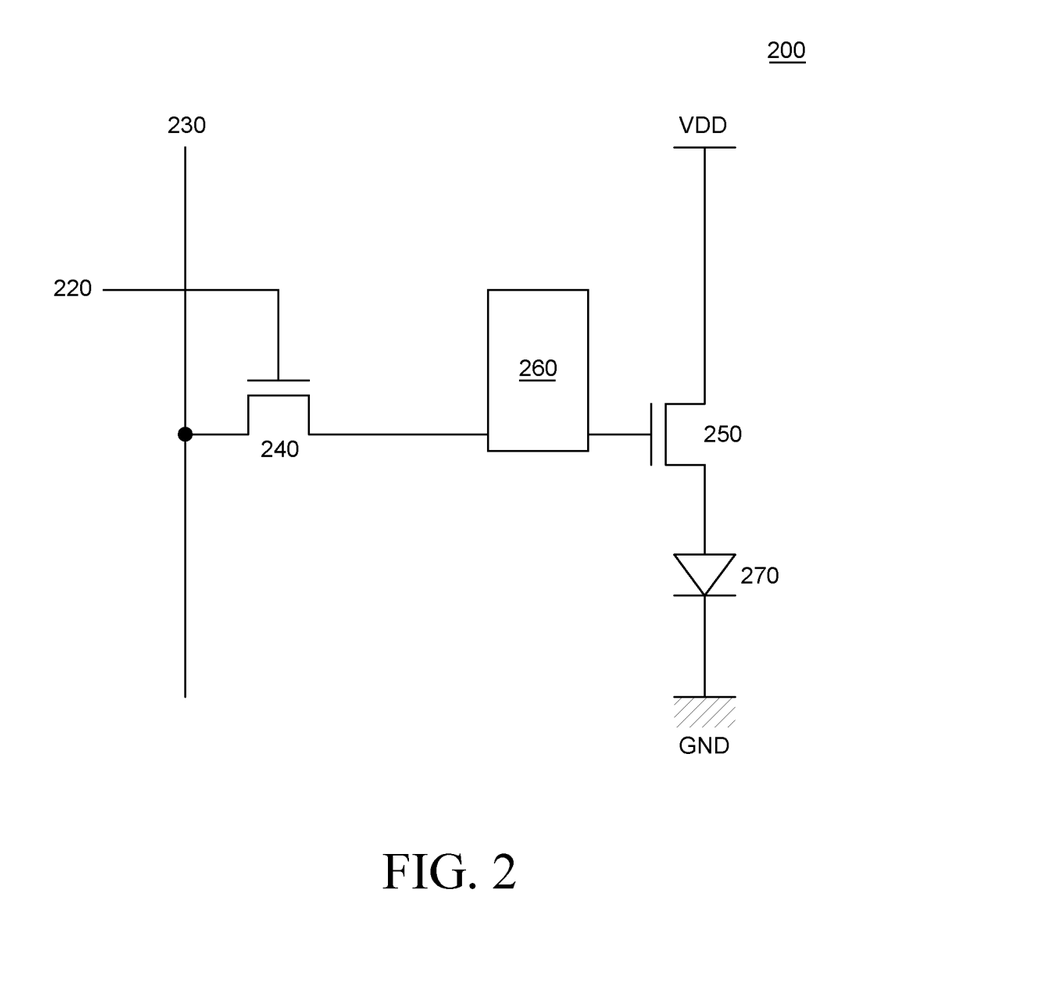
FIG. 2 is a circuit diagram of a pixel of an organic light emitting display device according to an exemplary embodiment of the present disclosure.

FIG. 2 is a circuit diagram of a pixel of an organic light emitting display device according to an exemplary embodiment of the present disclosure.

Referring to FIG. 2, a pixel of an organic light emitting display device 200 includes a switching transistor 240, a driving transistor 250, a compensating circuit 260, and an organic light emitting element 270.

The organic light emitting element 270 emits light according to a driving current formed by the driving transistor 250.

The switching transistor 240 performs a switching operation so that a data signal supplied through the data line 230 in accordance with the gate signal supplied through the gate line 220 is stored in a capacitor as a data voltage.

The driving transistor 250 operates such that a constant driving current flows between a high potential power line VDD and a low potential power line GND in accordance with the data voltage stored in the capacitor.

The compensating circuit 260 is a circuit for compensating a threshold voltage of the driving transistor 250 and is configured by one or more thin film transistors and capacitors. A configuration of the compensating circuit may vary depending on a compensating method.

In FIG. 2, the pixel of the organic light emitting display device 200 is configured to have a 2T (transistor) 1C (capacitor) configuration including a switching transistor 240, a driving transistor 250, a capacitor, and an organic light emitting element 270. However, when the compensating circuit 260 is added, the pixel may be configured to have various configurations such as 3T1C, 4T2C, 5T2C, 6T2C, and 7T2C.

Figure 3:
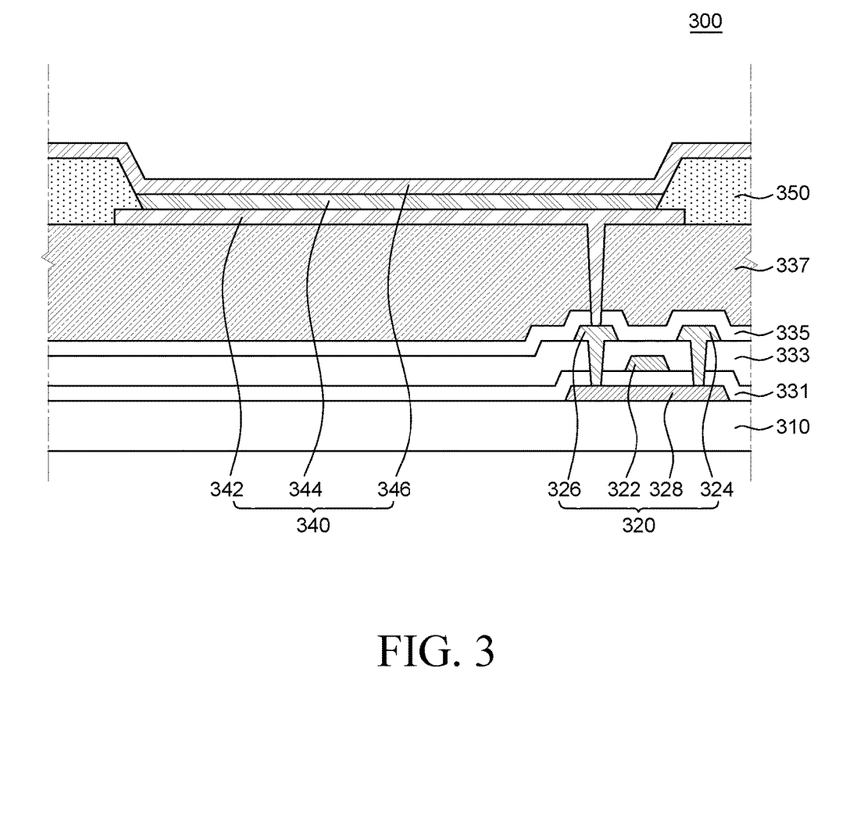
FIG. 3 is a cross-sectional view of a sub pixel of an organic light emitting display device according to an exemplary embodiment of the present disclosure.

FIG. 3 is a cross-sectional view of a sub pixel of an organic light emitting display device 300 according to an exemplary embodiment of the present disclosure.

Referring to FIG. 3, the organic light emitting display device 300 includes a substrate 310, a thin film transistor 320, and an organic light emitting element 340.

The substrate 310 serves to support and protect components of the organic light emitting display device 300 which are disposed thereon. Recently, the substrate 310 is formed of a flexible material having a flexible property so that the substrate 310 may be a flexible substrate.

For example, the substrate 310 may be a film type layer including one selected from a group consisting of a polyester polymer, a silicon polymer, an acrylic polymer, a polyolefin based polymer, and a copolymer thereof. Specifically, the substrate 310 may include at least one selected from polyethylene terephthalate (PET), polybutylene terephthalate (PBT), polysilane, polysiloxane, polysilazene, polycarbosilane, polyacrylate, polymethacrylate, polymethylacrylate, polymethylmetacrylate (PMMA), polyethylacylate, polyethylmetacrylate, cyclic olefin copolymer (COC), cyclic olefin polymer (COP), polyethylene (PE), polypropylene (PP), polyimide (PI), polystyrene (PS), polyacetal (POM), polyetheretherketone (PEEK), polyester sulfone (PES), polytetrafluoroethylene (PTFE), polyvinyl chloride (PVC), polycarbonate (PC), polyvinylidene fluoride (PVDF), perfluoroalkyl polymer (PFA), styrene acrylonitrile copolymer (SAN), and a combination thereof.

A buffer layer may be further disposed on the substrate 310. The buffer layer suppresses moisture or other foreign materials from being permeated through the substrate 310 and planarizes a surface of the substrate 310. The buffer layer is not an essential configuration and may not be disposed according to a type of the substrate 310 or a type of the thin film transistor 320 disposed on the substrate.

The thin film transistor 320 disposed on the substrate 310 includes a gate electrode 322, a source electrode 324, a drain electrode 326, and a semiconductor layer 328.

The semiconductor layer 328 may be configured by amorphous silicon or polycrystalline silicon. Since a mobility of the polycrystalline silicon is better than the amorphous silicon, the polycrystalline silicon has a low energy power consumption and high reliability. Therefore, the semiconductor layer 328 may be configured by the polycrystalline silicon which may be applied to the driving thin film transistor in the pixel, but is not limited thereto.

Recently, an oxide semiconductor attracts attention due to excellent mobility and uniformity. The oxide semiconductor may be formed of an indium tin gallium zinc oxide (InSnGaZnO) based material which is a quaternary metal oxide, an indium gallium zinc oxide (InGaZnO) based material, an indium tin zinc oxide (InSnZnO) based material, an indium aluminum zinc oxide (InAlZnO) based material, a tin gallium zinc oxide (SnGaZnO) based material, an aluminum gallium zinc oxide (AlGaZnO) based material, and a tin aluminum zinc oxide (SnAlZnO) based material which are ternary metal oxide, an indium zinc oxide (InZnO) based material, a tin zinc oxide (SnZnO) based material, an aluminum zinc oxide (AlZnO) based material, a zinc magnesium oxide (ZnMgO) based material, a tin magnesium oxide (SnMgO) based material, an indium magnesium oxide (InMgO) based material, and an indium gallium oxide (InGaO) based material which are binary metal oxide, an indium oxide (InO) based material, a tin oxide (SnO) based material, or a zinc oxide (ZnO) based material. However, a composition ratio of each element is not specifically limited.

The semiconductor layer 328 includes a source region and a drain region which include a p type or n type impurity, and a channel between the source region and the drain region. The semiconductor layer 328 may include a lightly doped area between the source region and the drain region which are adjacent to the channel.

A gate insulating layer 331 is an insulating film which is configured by a single layer or multiple layers of silicon oxide SiOx or silicon nitride SiNx and is disposed such that current flowing through the semiconductor layer 328 does not flow into the gate electrode 322. In this case, a ductility of silicon oxide is lower than a ductility of metal, but higher than a ductility of silicon nitride. Therefore, the gate insulating layer may be selectively formed of a single layer or multiple layers depending on the characteristic.

The gate electrode 322 serves as a switch which turns on or off the thin film transistor 420 based on an electrical signal which is transmitted through the gate line from the outside. The gate electrode 322 may be formed of a single layer or multiple layers of copper (Cu), aluminum (Al), molybdenum (Mo), chrome (Cr), gold (Au), titanium (Ti), nickel (Ni), and neodymium (Nd) which are conductive metals or an alloy thereof, but is not limited thereto.

The source electrode 324 and the drain electrode 326 are connected to the data line and transmit an electrical signal transmitted from the outside from the thin film transistor 320 to the organic light emitting element 340. The source electrode 324 and the drain electrode 326 may be configured by a single layer or multiple layers of a metal material such as copper (Cu), aluminum (Al), molybdenum (Mo), chrome (Cr), gold (Au), titanium (Ti), nickel (Ni), and neodymium (Nd) which are conductive metals or an alloy thereof, but are not limited thereto.

In order to insulate the gate electrode 322 from the source electrode 324 and the drain electrode 326, an interlayer insulating layer 333 configured by a single layer or multiple layers of silicon oxide SiOx or silicon nitride SiNx may be disposed between the gate electrode 322 and the source electrode 324/drain electrode 326.

A passivation layer 335 configured by an inorganic insulating layer such as silicon oxide SiOx or silicon nitride SiNx is disposed on the thin film transistor 320. The passivation layer 335 may suppress unnecessary electrical connection between components of the thin film transistor 320 and suppress contamination or damage from the outside. The passivation layer 335 may be omitted according to the configuration and the characteristic of the thin film transistor 320 and the organic light emitting element 340.

The thin film transistor 320 may be classified into a thin film transistor having an inverted staggered structure and a thin film transistor having a coplanar structure according to a position of the components of the thin film transistor 320. In the thin film transistor having an inverted staggered structure, the gate electrode is disposed on an opposite side to the source electrode and the drain electrode with respect to the semiconductor layer. As illustrated in FIG. 3, in the thin film transistor 320 having a coplanar structure, the gate electrode 322 is disposed on the same side as the source electrode 324 and the drain electrode 326 with respect to the semiconductor layer 328.

In FIG. 3, even though a thin film transistor 320 having a coplanar structure has been illustrated, the organic light emitting display device may include a thin film transistor having an inverted staggered structure.

For the convenience of description, even though only a driving thin film transistor is illustrated among various thin film transistors which may be included in the organic light emitting display device, a switching thin film transistor and a capacitor may also be included in the organic light emitting display device. In this case, when a signal is applied from a gate line, the switching thin film transistor transmits a signal from a data line to a gate electrode of the driving thin film transistor. The driving thin film transistor transmits a current which is transmitted through a power line by a signal transmitted from the switching thin film transistor, to an anode and controls emission by the current which is transmitted to the anode.

A planarization layer 337 is disposed on the thin film transistor 320 to protect the thin film transistor 320, lessen a step generated due to the thin film transistor 320, and reduce parasitic capacitance generated between the thin film transistor 320 and the gate line, the data line, and the organic light emitting element 340.

In this case, the planarization layer 337 may be formed of one or more materials of acrylic resin, epoxy resin, phenolic resin, polyamide resin, polyimides rein, unsaturated polyester resin, polyphenylene resin, polyphenylenesulfide resin, and benzocyclobutene, but is not limited thereto.

The organic light emitting element 340 disposed on the planarization layer 337 includes an anode 342, a light emitting unit 344, and a cathode 346.

The anode 342 may be disposed on the planarization layer 337. In this case, the anode 342 is an electrode which serves to supply holes to the light emitting unit 344 and may be electrically connected to the thin film transistor 320 through a contact hole in the planarization layer 337.

A bank 350 disposed on the anode 342 and the planarization layer 337 may define a pixel which divides an area which actually emits light. After forming a photoresist on the anode 342, the bank 350 is formed by a photolithography process. The photoresist refers to a photosensitive resin whose solubility in a developer is changed by action of light. The photoresist is exposed and developed to obtain a specific pattern. The photoresist is classified into a positive photoresist and a negative photoresist. The positive photoresist is a photoresist in which solubility in a developer of an exposing unit is increased by exposure. When the positive photoresist is developed, a pattern from which the exposing unit is removed is obtained. In contrast, the negative photoresist is a photoresist in which solubility in a developer of the exposing unit is significantly lowered by the exposure. When the negative photoresist is developed, a pattern from which a non-exposing unit is removed is obtained. In order to form the light emitting unit 344 of the organic light emitting element 340, a fine metal mask which is a deposition mask may be used. In this case, in order to suppress a damage which may be caused by the contact with the deposition mask disposed on the bank 350 and maintain a predetermined distance between the bank 350 and the deposition mask, a spacer which is configured by one of polyimide, photoacryl, and benzocyclobutene (BCB) which is a transparent organic material may be disposed above the bank 350.

The light emitting unit 344 is disposed between the anode 342 and the cathode 346. The light emitting unit 344 serves to emit light and includes at least one of a hole injection layer HIL, a hole transport layer HTL, an emissive layer, an electron transport layer ETL, and an electron injection layer EIL. Some components of the light emitting unit 444 may be omitted according to a structure and a characteristic of the organic light emitting display device 300. Here, as the emissive layer, an organic emissive layer and an inorganic emissive layer may be applied.

The cathode 346 is disposed on the light emitting unit 344 to supply electrons to the light emitting unit 344.

A detailed structure of the organic light emitting element 340 will be described with reference to FIG. 4.

An encapsulation layer may be disposed on the organic light emitting element 340 to suppress oxidation or damage of the thin film transistor 320 and the organic light emitting element 340, which are components of the organic light emitting display device 300, caused by moisture, oxygen, or impurities entering from the outside. The encapsulation unit may be formed by laminating a plurality of encapsulation layers, a foreign substance compensating layer, and a plurality of barrier films.

The encapsulation layer is disposed on an entire top surface of the thin film transistor 320 and the organic light emitting element 340 and may be configured by one of silicon nitride SiNx and aluminum oxide AlyOz which are inorganic materials, but is not limited thereto. An encapsulation layer may be further laminated to be disposed on the foreign substance compensating layer which is disposed on the encapsulation layer.

The foreign substance compensating layer is disposed on the encapsulation layer and uses silicon oxycarbon SiOCz, acryl or epoxy resin which is an organic material, but is not limited thereto. When a failure is caused due to a crack which is generated by foreign substances or particles which may be generated during a process, a curve or foreign substances are covered by the foreign substance compensating layer to compensate the failure.

The barrier film is disposed on the encapsulation layer and the foreign substance compensating layer so that the organic light emitting display device 300 may further delay penetration of oxygen and moisture from the outside. The barrier film is configured as a film having transparency and both side adhesiveness. The barrier film may be configured by any one of olefin, acrylic, and silicon based insulating materials. Alternatively, a barrier film which is configured by any one of copolyester thermoplastic elastomer (COP), cycoolefin copolymer (COC), and polycarbonate (PC) may be further laminated, but is not limited thereto.

Figure 4:
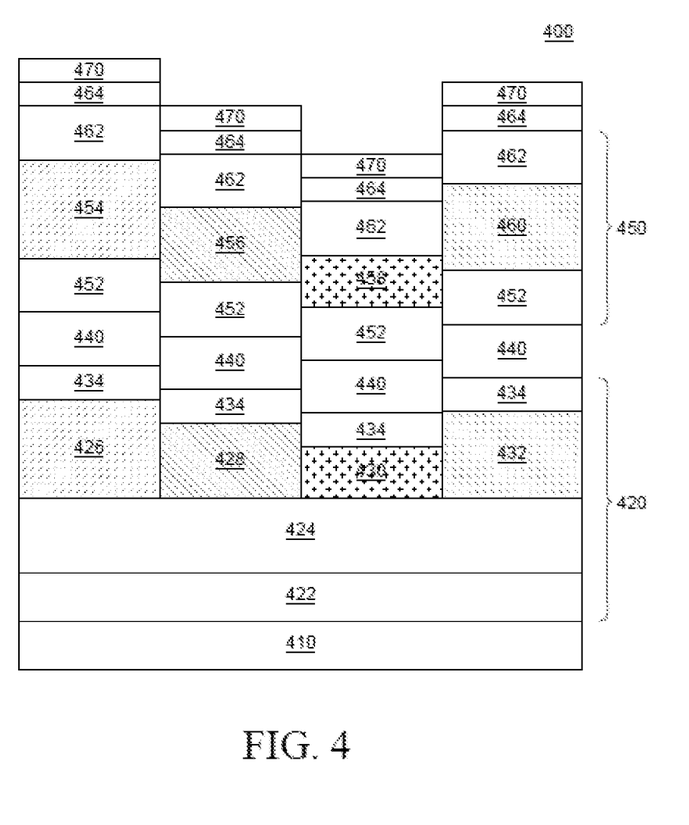
FIG. 4 is a cross-sectional view of an organic light emitting element included in an organic light emitting display device according to an exemplary embodiment of the present disclosure.

FIG. 4 is a cross-sectional view of an organic light emitting element included in an organic light emitting display device according to an exemplary embodiment of the present disclosure.

Referring to FIG. 4, an organic light emitting element which is included in an organic light emitting display device 400 includes an anode 410, a first light emitting unit 420, a charge generation layer 440, a second light emitting unit 450, and a cathode 470.

The anode 410 may be configured by indium tin oxide (ITO) or indium zinc oxide (IZO) which is a transparent conductive material, but is not limited thereto.

In the meantime, when the organic light emitting display device 400 is a top emission type which emits light toward an upper portion in which the cathode 470 is disposed, the anode 410 may further include a reflective layer. Therefore, light emitted from the first light emitting unit 420 and the second light emitting unit 450 is reflected from the anode 410 to be more smoothly discharged to an upper direction in which the cathode 470 is disposed. Further, the anode 410 may be a double layered structure in which a transparent conductive layer configured by a transparent conductive material and a reflective layer are sequentially laminated or a triple layered structure in which a transparent conductive layer, a reflective layer, and a transparent conductive layer are sequentially laminated. The reflective layer may be silver (Ag) or an alloy containing silver.

The first light emitting unit 420 and the second light emitting unit 450 are laminated to be disposed between the anode 410 and the cathode 470.

The first light emitting unit 420 disposed on the anode 410 includes a hole injection layer 422, a first hole transport layer 424, and pixel emissive layers 426, 428, 430, and 432 of individual sub pixels and a first electron transport layer 434. More specifically, the pixel emissive layers 426, 428, 430, and 432 are formed of a first pixel emissive layer 426, a second pixel emissive layer 428, a third pixel emissive layer 430, and a fourth pixel emissive layer 432 of the first light emitting unit 420.

In order to allow the holes to smoothly move from the anode 410 to the first light emitting unit 420, the hole injection layer 422 and the first hole transport layer 424 are disposed on the anode 410.

The hole injection layer 422 is disposed on the anode 410 to smoothly inject the holes. For example, the hole injection layer may be formed of any one or more of HAT-CN (dipyrazino[2,3-f:2',3'-h]quinoxaline-2,3,6,7,10.11-hexacarbonitrile), CuPc(phthalocyanine), and NPD(N,N'-bis(naphthalene-1-yl)-N,N'-bis(phenyl)-2,2'-dimethylbenzidine).

The first hole transport layer 424 is disposed on the hole injection layer 422 to smoothly transmit the holes to the pixel emissive layers 426, 428, 430, and 432. For example, the first hole transport layer 424 may be formed of any one or more of NPD(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine), s-TAD(2,2',7,7'-tetrakis (N,N-dimethylamino)-9,9-spirofluorene), and MTDATA(4,4',4"-Tris(N-3-methylphenyl-N-phenyl-amino)-triphenylamine).

The pixel emissive layers 426, 428, 430, and 432 are disposed on the first hole transport layer 424 and include a material which may emit light with a specific color for every sub pixel to emit light with a specific color. In this case, the light emitting material may be formed using a phosphor or a fluorescent material.

When the first pixel emissive layer 426 emits red light, an emitting peak wavelength may be in a range of 600 nm to 650 nm. The first pixel emissive layer may include a host material including CBP(4,4'-bis(carbazol-9-yl)biphenyl) or mCP(1,3-bis(carbazol-9-yl)benzene) and may be formed of a phosphor including a dopant including one or more of PIQIr(acac)(bis(1-phenylisoquinoline)(acetylacetonate) iridium), PQIr(acac)(bis(1-phenylquinoline)(acetylacetonate) iridium), PQIr(tris(1-phenylquinoline) iridium), and PtOEP(octaethylporphyrin platinum). Alternatively, the first pixel emissive layer may be formed of a fluorescent material including PBD:Eu(DBM)3(Phen) or perylene.

Here, the peak wavelength λmax refers to a maximum wavelength of electroluminescence (EL). A wavelength at which the emissive layers configuring the light emitting unit emit unique light is referred to as a photoluminescence (PL) and light which is emitted due to the influence of a thickness or optical characteristics of the layers which configure the emissive layers is referred to as emittance. In this case, electroluminescence (EL) refers to light which is finally emitted by the organic light emitting display device and is represented by a product of photoluminescence (PL) and emittance.

When the second pixel emissive layer 428 emits green light, an emitting peak wavelength may be in the range of 520 nm to 540 nm. The second pixel emissive layer includes a host material containing CBP or mCP and may be formed of a phosphor including a dopant material such as Ir complex including Ir(ppy)3(tris(2-phenylpyridine)iridium). Further, the second pixel emissive layer may be formed of a fluorescent material including Alq3(tris(8-hydroxyquinolino) aluminum).

When the third pixel emissive layer 430 emits blue light, an emitting peak wavelength may be in the range of 440 nm to 480 nm. The third pixel emissive layer includes a host material containing CBP or mCP and may be formed of a phosphor including a dopant material including FIrPic(bis (3,5-difluoro-2-(2-pyridyl)phenyl-(2-carboxypyridyl) iridium). Further, the third pixel emissive layer may be formed of a fluorescent material including any one of spiro-DPVBi(4,4'-Bis(2,2-diphenyl-ethen-1-yl)biphenyl), DSA(1-4-di-[4-(N,N-di-phenyl)amino]styryl-benzene), PFO(polyfluorene) based polymers, and PPV(polyphenylenevinylene) based polymers, but is not limited thereto.

When the fourth pixel emissive layer 432 emits yellow-green light, an emitting peak wavelength may be in the range of 520 nm to 590 nm and the fourth pixel emissive layer may be formed of a phosphor. Further, the fourth pixel emissive layer 432 may be formed by doping a yellow-green dopant on a host material formed of a carbazole based compound or a metal complex. As the carbazole based compound, CBP (4,4'-bis(carbazol-9-yl)biphenyl), a CBP derivative, mCP(1, 3-bis(carbazol-9-yl)benzene) or mCP derivative may be used. As the metal complex, ZnPBO(phynyloxazole) metal complex or ZnPBT(phenylthiazole) metal complex may be used.

In which case, when the peak wavelength of the fourth pixel emissive layer 432 is 545 nm or longer, the organic light emitting display device may achieve power consumption with an optimal efficiency, which will be described in detail with reference to the following tables.

According to a micro cavity effect, light is repeatedly reflected between two layers which are spaced apart from each other as long as an optical length so that light with a specific wavelength is amplified by constructive interference.

When the organic light emitting display device 400 emits different light from every sub pixel, wavelengths of light are different from each other. Therefore, in order to implement micro cavity, a resonant distance needs to be set for every wavelength of the light in the individual sub pixels. In order to set different resonant distances for every sub pixel, in the organic light emitting display device 400, thicknesses of the emissive layers 426, 428, 430, and 432 may be variably adjusted.

Among the pixel emissive layers 426, 428, 430, and 432 of the organic light emitting display device 400 according to the exemplary embodiment, the first pixel emissive layer 426 which emits red light has the largest thickness. The fourth pixel emissive layer 432 which emits yellow-green light, the second pixel emissive layer 428 which emits green light, and the third pixel emissive layer 430 which emits blue light have large thicknesses in this order. In this case, the micro cavity effect of the organic light emitting display device according to the thickness of the emissive layer may vary according to the structure and the characteristic of the entire organic light emitting display device and a structure and a characteristic of the emissive layer.

The first electron transport layer 434 is disposed on the pixel emissive layers 426, 428, 430, and 432 so that the electrons may smoothly move from the charge generation layer 440 to the pixel emissive layers 426, 428, 430, and 432.

For example, the first electron transport layer 434 may be formed of any one or more of Liq(8-hydroxyquinolinato-lithium), PBD(2-(4-biphenyl)-5-(4-tert-butylphenyl)-1,3,4-oxadiazole), TAZ(3-(4-biphenyl)4-phenyl-5-tert-butylphenyl-1,2,4-triazole), spiro-PBD, BCP(2,9-Dimethyl-4,7-diphenyl-1,10-phenanthroline), and BAlq(bis(2-methyl-8-quinolinolate)-4-(phenylphenolato)aluminum).

The charge generation layer 440 is disposed on the first electron transport layer 434 so that a charge balance between the first light emitting unit 420 and the second light emitting unit 450 may be adjusted.

The charge generation layer 440 may include an N type charge generation layer and a P type charge generation layer. In this case, the N type charge generation layer injects the electrons to the first light emitting unit 420. The N type charge generation layer may be formed of an organic layer doped with an alkaline metal such as lithium (Li), sodium (Na), potassium (K), or cesium (Cs), or an alkaline earth metal such as magnesium (Mg), strontium (Sr), barium (Ba), or radium (Ra).

The P type charge generation layer injects holes to the second light emitting unit 450 and is formed of an organic layer including a P type dopant.

The second light emitting unit 450 disposed on the charge generation layer 440 includes a second hole transport layer 452, and emissive layers 454, 456, 458, and 460 of individual sub pixels, and a second electron transport layer 462. More specifically, the emissive layers 454, 456, 458, and 460 are formed of a first pixel emissive layer 454, a second pixel emissive layer 456, a third pixel emissive layer 458, and a fourth pixel emissive layer 460 of the second light emitting unit 450.

In this case, the first light emitting unit 420 and the second light emitting unit 450 are connected in series. Therefore, even though a voltage is increased as compared with an organic light emitting display device having a single light emitting unit, the current is constant so that the efficiency may be further increased. However, the present disclosure is not limited thereto, and a single light emitting unit may be applied according to the characteristic and the structure of the organic light emitting display device.

The second hole transport layer 452 is disposed on the charge generation layer 440 to smoothly transmit the holes to the pixel emissive layers 454, 456, 458, and 460. The second hole transport layer 452 may be formed using the same material as the first hole transport layer 424 and may use a different material therefrom according to the structure and the characteristic of the organic light emitting display device.

The pixel emissive layers 454, 456, 458, and 460 are disposed on the second hole transport layer 452 and include a material which may emit light with a specific color for every sub pixel to emit light with a specific color. In this case, the light emitting material may be formed using a phosphor or a fluorescent material.

In this case, when the first pixel emissive layer 426 emits red light, the emitting peak wavelength may be in the range of 600 nm to 650 nm. When the second pixel emissive layer 428 emits green light, the emitting peak wavelength may be in the range of 520 nm to 540 nm. When the third pixel emissive layer 430 emits blue light, the emitting peak wavelength may be in the range of 440 nm to 480 nm. When the fourth pixel emissive layer 432 emits yellow-green light, the emitting peak wavelength may be in the range of 520 nm to 590 nm. The pixel emissive layers 454, 456, 458, and 460 of the second light emitting unit 450 may be formed using the same material as the pixel emissive layers 426, 428, 430, and 432 of the first light emitting unit 420 and may use a different material therefrom according to the structure and the characteristic of the organic light emitting display device.

In order to set different resonant distances for every sub pixel, thicknesses of the pixel emissive layers 454, 456, 458, and 460 may be variably adjusted. Similarly to the pixel emissive layers 426, 428, 430, and 432 of the first light emitting unit 420, the first pixel emissive layer 454 which emits red light has the largest thickness. The fourth pixel emissive layer 460 which emits yellow-green light, the second pixel emissive layer 456 which emits green light, and the third pixel emissive layer 458 which emits blue light have large thicknesses in this order. The micro cavity effect of the organic light emitting display device according to the thickness of the emissive layer may vary according to the structure and the characteristic of the entire organic light emitting display device and a structure and a characteristic of the emissive layer.

The second electron transport layer 462 is disposed on the pixel emissive layers 454, 456, 458, and 460 so that the electrons may smoothly move from the cathode 470 to the pixel emissive layers 454, 456, 458, and 460. The second electron transport layer 462 may be formed using the same material as the first electron transport layer 434 and may use a different material therefrom according to the structure and the characteristic of the organic light emitting display device.

In this case, an electron injection layer 464 may be further disposed on the second electron transport layer 462. The electron injection layer 464 is an organic layer which smoothly injects the electron from the cathode 470 and may be omitted according to the structure and the characteristic of the organic light emitting display device 400. The electron injection layer 464 may be a metallic inorganic compound such as BaF2, LiF, NaCl, CsF, Li2O, and BaO or may be one or more organic compounds of HAT-CN(dipyrazino[2,3-f: 2',3'-h]quinoxaline-2,3,6,7,10.11-hexacarbonitrile), CuPc (phthalocyanine), and NPD(N,N'-bis(naphthalene-1-yl)-N, N'-bis(phenyl)-2,2'-dimethylbenzidine).

Further, an electron blocking layer or a hole blocking layer which blocks the flow of the holes or electrons is further disposed in a position adjacent to the pixel emissive layers 426, 428, 430, 432, 454, 456, 458, and 460. By doing this, when the electrons are injected to the emissive layer, the electrons are suppressed from moving from the emissive layer to pass through the adjacent hole transport layer or when the holes are injected to the emissive layer, the holes are suppressed from moving from the emissive layer to pass through the adjacent electron transport layer. Therefore, luminous efficiency may be improved.

The cathode 470 is disposed on the second light emitting unit 450 to supply the electrons to the light emitting units 420 and 450. The cathode 470 needs to supply the electrons so that the cathode may be configured of a metallic material which is a conductive material having a low work function, such as magnesium (Mg) or silver-magnesium (Ag:Mg), but is not limited thereto. Alternatively, when the organic light emitting display device 400 is a top emission type, the cathode 470 may be transparent conductive oxide such as indium tin oxide (ITO), indium zinc oxide (IZO), indium tin zinc oxide (ITZO), zinc oxide (ZnO), and tin oxide (TiO).

The organic light emitting display device according to the exemplary embodiment of the present disclosure may be applied to display devices including a TV, a mobile phone, a tablet PC, a monitor, a laptop computer, a smart watch, and a display device for a vehicle. Alternatively, the organic light emitting display device according to the exemplary embodiment of the present disclosure may be applied to a wearable display device, a foldable display device, a rollable display device, a curved display device, a bendable display device, and a display device for a vehicle. Alternatively, the organic light emitting display device according to the exemplary embodiment of the present disclosure may be applied to a virtual reality (VR) and an augmented reality (AR).

When the organic light emitting display device has three pixel emissive layers, red light, green light, and blue light are emitted and luminance of red light, green light, and blue light is mixed with a positive ratio of tristimuls values or spectrum matching coefficients (CIE 1931) of white light to implement white light. The organic light emitting display device according to an exemplary embodiment of the present disclosure further includes a sub pixel including a yellow-green emissive layer to lower a luminance efficiency for a sub pixel including a red emissive layer which has a lower luminous efficiency than other emissive layers. Therefore, the power consumption of the organic light emitting display device may be lowered.

It is understood that as compared with an organic light emitting display device having sub pixels which emit red, green, and blue light of a comparative example, a power consumption of the organic light emitting display device according to the exemplary embodiment of the present disclosure which further includes a sub pixel which emits yellow-green light is significantly low.

Further, in the organic light emitting display device according to the exemplary embodiment of the present disclosure, at least two light emitting units are configured, so that efficiency or a life span of the emissive layers are improved as compared with the organic light emitting display device in which one light emitting unit is configured. Therefore, the efficiency and the lifespan of the organic light emitting display device may be improved.

First, when white light is emitted, x and y of a color coordinate CIE(1931) are 0.313 and 0.329 and a correlate color temperature (CCT) is 6490 K, power consumptions of an organic light emitting display device of Comparative Example 1 and an organic light emitting display device of Examples 1 to 4 are compared. Comparative Example 1 is an organic light emitting display device which is configured by one light emitting unit having sub pixels which emit red, green, and blue light.

TABLE 1

|  | Maximum peak wavelength of yellow-green pixel | Power consumption (Watt) |
| --- | --- | --- |
| Comp. 1 | — | 4.1 |
| Example 1 | 538 nm | 4.2 |
| Example 2 | 550 nm | 3.8 |
| Example 3 | 558 nm | 3.6 |
| Example 4 | 572 nm | 3.5 |

Next, when white light is emitted, x and y of a color coordinate CIE(1931) are 0.300 and 0.315 and a correlate color temperature (CCT) is 7440 K, power consumptions of an organic light emitting display device of Comparative Example 2 and an organic light emitting display device of Examples 5 to 8 are compared. Comparative Example 2 is an organic light emitting display device which is configured by one light emitting unit having sub pixels which emit red, green, and blue light.

TABLE 2

|  | Maximum peak wavelength of yellow-green pixel | Power consumption (Watt) |
| --- | --- | --- |
| Comp. 2 | — | 4.3 |
| Example 5 | 538 nm | 4.4 |
| Example 6 | 550 nm | 4.1 |
| Example 7 | 558 nm | 3.8 |
| Example 8 | 572 nm | 3.8 |

As seen from the results of Tables 1 and 2, when a maximum peak wavelength of the yellow-green emissive layer is 545 nm or longer, it is understood that as compared with the organic light emitting display device of Comparative Examples 1 and 2, the power consumption of the organic light emitting display device of the present disclosure is significantly low.

Therefore, the organic light emitting display device of the present disclosure configures sub pixels including red, green, blue, yellow-green emissive layers to lower the power consumption of the organic light emitting display device.

Further, in the organic light emitting display device according to the exemplary embodiment of the present disclosure, at least two emitting units which include sub pixels including red, green, blue, and yellow-green emissive layers are configured. Therefore, it is understood that power consumption of the organic light emitting display device may be lowered as compared with the organic light emitting display device in which one light emitting unit is configured.

According to an exemplary embodiment of the present disclosure, an electroluminescent display device includes: an anode, a first light emitting unit which is disposed on the anode and includes a first emissive layer, a charge generation layer disposed on the first light emitting unit, a second light emitting unit which is disposed on the charge generation layer and includes a second emissive layer, and a cathode disposed on the second light emitting unit in which each of the first light emitting unit and the second light emitting unit includes a first pixel, a second pixel, a third pixel, and a fourth pixel, and the first pixel includes an emissive layer which emits red light, the second pixel includes an emissive layer which emits green light, the third pixel includes an emissive layer which emits blue light, and the fourth pixel includes an emissive layer which emits different color light from the first pixel, the second pixel, and the third pixel.

The anode may include a reflective layer.

The cathode may include a transparent conductive layer.

The fourth pixel may include an emissive layer which emits yellow-green light.

A maximum wavelength range of the fourth pixel may be 545 nm or longer and 590 nm or shorter.

Each of the first light emitting unit and the second light emitting unit may include at least one of a hole injection layer, a hole transport layer, an electron transport layer, and an electron injection layer.

The electroluminescent display device may further include: a bank which is disposed on the anode to divide areas of the first pixel, the second pixel, the third pixel, and the fourth pixel.

According to another exemplary embodiment of the present disclosure, an electroluminescent display device includes: an anode, a light emitting unit which is disposed on the anode and includes an emissive layer; and a cathode disposed on the light emitting unit, in which at least one light emitting unit is provided, and the light emitting unit includes a plurality of pixel emissive layers corresponding to a first pixel, a second pixel, a third pixel, and a fourth pixel which emit different color light.

The anode may include a reflective layer.

The cathode may include a transparent conductive layer.

The first pixel may emit red light, the second pixel may emit green light, the third pixel may emit blue light, and the fourth pixel may emit yellow-green light.

A maximum wavelength range of the fourth pixel may be 545 nm or longer and 590 nm or shorter.

Each of the light emitting units may include at least one of a hole injection layer, a hole transport layer, an electron transport layer, and an electron injection layer.

The electroluminescent display device may further include: a bank which is disposed on the anode to divide areas of the first pixel, the second pixel, the third pixel, and the fourth pixel.

According to another exemplary embodiment of the present disclosure, an electroluminescent display device includes an anode, a first light emitting unit which is disposed on the anode and includes a first emissive layer, a charge generation layer on the first emissive layer, a second light emitting unit which is disposed on the charge generation layer and includes a second emissive layer; and a cathode disposed on the second light emitting unit, in which each of the first light emitting unit and the second light emitting unit includes a plurality of pixel emissive layers corresponding to a first pixel, a second pixel, a third pixel, and a fourth pixel, and the first pixel emits red light, the second pixel emits green light, the third pixel emits blue light, and the fourth pixel emits yellow-green light so that when the first pixel, the second pixel, the third pixel, and the fourth pixel emit light to represent white light, a luminous efficiency for a pixel including an emissive layer having a low luminous efficiency among the pixels is lowered.

A maximum wavelength range of the fourth pixel may be 545 nm or longer and 590 nm or shorter.

Each of the light emitting units may include at least one of a hole injection layer, a hole transport layer, an electron transport layer, and an electron injection layer.

The electroluminescent display device may further include: a bank which is disposed on the anode to divide areas of the first pixel, the second pixel, the third pixel, and the fourth pixel.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical spirit of the present disclosure. The scope of the technical spirit of the present disclosure is not limited thereto. Therefore, it should be understood that the above-described exemplary embodiments are illustrative in all aspects and do not limit the present disclosure. The protection scope of the present disclosure should be interpreted based on the following appended claims and it should be appreciated that all technical spirits included within a range equivalent thereto are included in the protection scope of the present disclosure.

What is claimed is:

1. An electroluminescent display device, comprising:
an anode;
a first light emitting unit which is on the anode and includes a first emissive layer;
a charge generation layer on the first light emitting unit;
a second light emitting unit which is on the charge generation layer and includes a second emissive layer; and
a cathode on the second light emitting unit,
wherein each of the first light emitting unit and the second light emitting unit includes a first pixel, a second pixel, a third pixel, and a fourth pixel, and the first pixel includes an emissive layer which emits red light, the second pixel includes an emissive layer which emits green light, the third pixel includes an emissive layer which emits blue light, and the fourth pixel includes an emissive layer which emits different color light from the first pixel, the second pixel, and the third pixel, wherein the emissive layer of the first pixel emits red light, the emissive layer of the fourth pixel emissive layer that emits yellow-green light is thinner than the emissive layer of the first pixel, the emissive layer of the second pixel that emits green light is thinner than the emissive layer of the fourth pixel, and the emissive layer of the third pixel that emits blue light is thinner than the emissive layer of the second pixel.

2. The electroluminescent display device according to claim 1, wherein the anode includes a reflective layer.

3. The electroluminescent display device according to claim 1, wherein the cathode includes a transparent conductive layer.

4. The electroluminescent display device according to claim 1, wherein the fourth pixel includes an emissive layer which emits yellow-green light.

5. The electroluminescent display device according to claim 4, wherein a maximum wavelength range of the fourth pixel is 545 nm or longer and 590 nm or shorter.

6. The electroluminescent display device according to claim 1, wherein each of the first light emitting unit and the second light emitting unit includes at least one of a hole injection layer, a hole transport layer, an electron transport layer, and an electron injection layer.

7. The electroluminescent display device according to claim 1, further comprising:
a bank which is disposed on the anode to divide areas of the first pixel, the second pixel, the third pixel, and the fourth pixel.

8. An electroluminescent display device, comprising:
an anode;
a light emitting unit which is disposed on the anode and includes an emissive layer; and
a cathode disposed on the light emitting unit,
wherein at least one light emitting unit is provided and the light emitting unit includes a plurality of pixel emissive layers corresponding to a first pixel, a second pixel, a third pixel, and a fourth pixel which emit different color light,
wherein a pixel emissive layer corresponding to the first pixel emits red light, a pixel emissive layer corresponding to the fourth pixel emissive layer that emits yellow-green light is thinner than the pixel emissive layer corresponding to the first pixel, a pixel emissive layer corresponding to the second pixel that emits green light is thinner than the pixel emissive layer corresponding to the fourth pixel, and a pixel emissive layer corresponding to the third pixel that emits blue light is thinner than the pixel emissive layer corresponding to the second pixel.

9. The electroluminescent display device according to claim 8, wherein the anode includes a reflective layer.

10. The electroluminescent display device according to claim 8, wherein the cathode includes a transparent conductive layer.

11. The electroluminescent display device according to claim 8, wherein the first pixel emits red light, the second pixel emits green light, the third pixel emits blue light, and the fourth pixel emits yellow-green light.

12. The electroluminescent display device according to claim 11, wherein a maximum wavelength range of the fourth pixel is 545 nm or longer and 590 nm or shorter.

13. The electroluminescent display device according to claim 8, wherein the light emitting unit includes at least one of a hole injection layer, a hole transport layer, an electron transport layer, and an electron injection layer.

14. The electroluminescent display device according to claim 8, further comprising:
a bank which is disposed on the anode to divide areas of the first pixel, the second pixel, the third pixel, and the fourth pixel.

15. An electroluminescent display device, comprising:
an anode;
a first light emitting unit which is disposed on the anode and includes a first emissive layer;
a charge generation layer on the first emissive layer;
a second light emitting unit which is disposed on the charge generation layer and includes a second emissive layer; and
a cathode disposed on the second light emitting unit,
wherein each of the first light emitting unit and the second light emitting unit includes a plurality of pixel emissive layers corresponding to a first pixel, a second pixel, a third pixel, and a fourth pixel, and the first pixel emits red light, the second pixel emits green light, the third pixel emits blue light, and the fourth pixel emits yellow-green light so that when the first pixel, the second pixel, the third pixel, and the fourth pixel emit light to represent white light, a luminous efficiency for a pixel including an emissive layer having a low luminous efficiency among pixels is lowered;
wherein a pixel emissive layer corresponding to the fourth pixel emissive layer that emits yellow-green light is thinner than the pixel emissive layer corresponding to the first pixel, a pixel emissive layer corresponding to the second pixel that emits green light is thinner than the pixel emissive layer corresponding to the fourth pixel, and a pixel emissive layer corresponding to the third pixel that emits blue light is thinner than the pixel emissive layer corresponding to the second pixel.

16. The electroluminescent display device according to claim 15, wherein a maximum wavelength range of the fourth pixel is 545 nm or longer and 590 nm or shorter.

17. The electroluminescent display device according to claim 15, wherein each of the light emitting units includes at least one of a hole injection layer, a hole transport layer, an electron transport layer, and an electron injection layer.

18. The electroluminescent display device according to claim 15, further comprising:
a bank which is disposed on the anode to divide areas of the first pixel, the second pixel, the third pixel, and the fourth pixel.

* * * * *